United States Patent [19]

Kung

[11] Patent Number: 5,504,026
[45] Date of Patent: Apr. 2, 1996

[54] METHODS FOR PLANARIZATION AND ENCAPSULATION OF MICROMECHANICAL DEVICES IN SEMICONDUCTOR PROCESSES

[75] Inventor: Joseph T. Kung, Boston, Mass.

[73] Assignee: Analog Devices, Inc., Norwood, Mass.

[21] Appl. No.: 422,036

[22] Filed: Apr. 14, 1995

[51] Int. Cl.$^6$ .................................................. H01L 21/784
[52] U.S. Cl. ............................ 437/51; 437/54; 437/927
[58] Field of Search .................................. 437/51, 54, 901, 437/927; 148/DIG. 73

[56] References Cited

U.S. PATENT DOCUMENTS

| | | | |
|---|---|---|---|
| 4,896,098 | 1/1990 | Haritonidis et al. | 324/663 |
| 5,149,673 | 9/1992 | MacDonald et al. | 437/203 |
| 5,194,402 | 3/1993 | Ehrfeld et al. | 437/229 |
| 5,236,118 | 8/1993 | Bower et al. | 437/51 |
| 5,326,726 | 7/1994 | Tsang et al. | 437/228 |

OTHER PUBLICATIONS

Wolf et al. "Silicon Processing For The VLSI ERA", vol. 1, Process Technology, Lattice Press, Sunset Beach, CA, (1990), pp. 155–156.
Wolf et al. "Silicon Processing For The VLSI ERA", vol. 2, Process Integration, Lattice Press, Sunset Beach, CA, (1990), pp. 65–67.
M. W. Judy et al "Polysilicon Hollow Beam Lateral Resonators", Proceedings, IEEE Micro Electro Mechanical Systems, Fort Lauderdale, FL, Feb. 7–10, 1993, pp. 265–271.
K. Lebouitz et al, "Permeable Polysilicon Etch–Access Windows for Microshell Fabrication", Digest 8th Int. Conf. Sold–State Sensors and Actuators, and Eurosensors IX, Stockholm, Jun. 25–29, 1995, pp. 224–227.
Ikeda et al, "Silicon Pressure Sensor Integrates Resonant Strain Gauge on Diaphragm", Sensors and Actuators, A21–A23 (1990), pp. 146–150.
Ikeda et al, "Three–dimensional Micromachining of Silicon Pressure Sensor Integrating Resonant Strain Gauge on Diaphragm, Sensors and Actuators", A21–A23 (1990), pp. 1007–1010.

*Primary Examiner*—Chandra Chaudhari
*Attorney, Agent, or Firm*—Wolf, Greenfield & Sacks

[57] ABSTRACT

A method for fabricating a micromechanical device and a semiconductor circuit on a substrate includes the steps of forming the micromechanical device on a device area of the substrate, the micromechanical device being embedded in a sacrificial material, selectively depositing a planarization layer on the substrate in a circuit area thereof, forming the semiconductor circuit on the planarization layer in the circuit area and removing the sacrificial material from the embedded micromechanical device. In a preferred embodiment, the planarization layer is an epitaxial silicon layer. A protective cap may be formed over the micromechanical device, so that it is completely encapsulated and is thereby protected against particulate contamination.

27 Claims, 3 Drawing Sheets

METHODS FOR PLANARIZATION AND ENCAPSULATION OF MICROMECHANICAL DEVICES IN SEMICONDUCTOR PROCESSES

FIELD OF THE INVENTION

This invention relates to methods for fabricating micromechanical devices and semiconductor circuits on a substrate and, more particularly, to methods for planarizing micromechanical devices and semiconductor circuits on a substrate to facilitate fabrication.

BACKGROUND OF THE INVENTION

The fabrication of micromechanical sensors on microchips is of great interest in many industries because of its potential to reduce the size and cost of devices for sensing environmental and other conditions. An accelerometer is one example of a type of sensor which has wide application possibilities. An accelerometer comprises an acceleration sensing transducer, or sensor, and a sensing circuit for producing an output signal that is representative of the acceleration sensed by the transducer. Ideally, the acceleration sensing transducer and the sensing circuit are fabricated on a single substrate for reasons of size, cost and improved operation. However, due to lack of compatibility between processes for fabricating micromechanical sensors and processes for fabricating semiconductor circuits, the integration of micromechanical sensors and semiconductor circuits into monolithic devices has proven difficult. Methods for fabricating a monolithic chip containing integrated circuitry and a suspended microstructure are disclosed in U.S. Pat. No. 5,326,726 issued Jul. 5, 1994, to Tsang et al.

A micromechanical sensor is typically in the form of a suspended microstructure. In one example of a suspended microstructure, a bridge is suspended above a substrate by four corner anchors. The bridge comprises a central beam having a plurality of movable fingers extending transversely therefrom. A suspended stationary finger is positioned parallel and adjacent to each movable finger of the bridge. The stationary fingers are also suspended on anchors and are cantilevered over the substrate. Typically, the suspended microstructure is embedded in silicon oxide until near the end of the fabrication process. The embedded micromechanical sensor forms a mesa that may have a vertical dimension above the substrate surface of several micrometers.

Because of the relatively high temperatures used in fabricating the micromechanical sensor, it is most practical to fabricate the micromechanical sensor before the semiconductor circuit. However, the presence of the relatively thick micromechanical sensor on the substrate poses problems in fabricating the semiconductor circuit. Typical optical steppers used to pattern circuit features have a depth of focus of about 0.5 micrometers. Thus, differences in height of several micrometers on the substrate surface cause a reduction in resolution. Furthermore, the presence of raised features on the substrate causes difficulty in spinning of photoresists during processing. In general, it is desirable to have a substantially flat upper surface during fabrication of the semiconductor circuit.

A microbridge fabricated in a recess etched in a substrate so that the microbridge is flush with the surface of the substrate is disclosed in U.S. Pat. No. 4,896,098 issued Jan. 23, 1990 to Haritonidis et al. The use of an epitaxial layer to encapsulate a silicon pressure sensor is disclosed by K. Ikeda et al, *Sensors and Actuators*, A21–A23 (1990), pages 1007–1010 and by K. Ikeda et al, *Sensors and Actuators*, A21–A23 (1990) pages 146–150.

SUMMARY OF THE INVENTION

According to the present invention, a method for fabricating a micromechanical device and a semiconductor circuit on a substrate is provided. The method comprises the steps of forming the micromechanical device on a device area of the substrate, the micromechanical device being embedded in a sacrificial material, forming a planarization layer on the substrate in a circuit area, forming the semiconductor circuit on the planarization layer in the circuit area, and removing the sacrificial material from the embedded micromechanical device. The planarization layer is formed with an upper surface that is substantially coplanar with the upper surface of the micromechanical device.

In a preferred embodiment, the planarization layer is an epitaxial silicon layer. The planarization layer may be formed such that its upper surface is substantially coplanar with the upper surface of the embedded micromechanical device. Alternatively, the planarization layer may be formed such that its upper surface is at least slightly above the upper surface of the embedded micromechanical device. Then, the planarization layer is subjected to a grinding process until its upper surface is substantially coplanar with the upper surface of the embedded micromechanical device.

The step of forming the planarization layer typically includes conditioning the surface of the substrate in the circuit area. In a preferred embodiment, the sacrificial material comprises silicon oxide, and the conditioning step comprises etching the silicon oxide in the circuit area prior to epitaxial deposition. In one embodiment, the micromechanical device comprises an acceleration sensor, and the semiconductor circuit comprises a sensing circuit connected to the acceleration sensor.

According to another aspect of the invention, the method may further include the steps of forming a buffer layer on the substrate prior to the step of depositing the planarization layer, and etching the buffer layer to leave a sidewall spacer on the micromechanical device. In a preferred embodiment, the sidewall spacer comprises conductive polysilicon, which may be connected to a reference potential for electrical shielding of the micromechanical device. In addition to polysilicon, the sidewall spacer may include a silicon nitride layer to protect any adjacent oxide which may be present.

According to another aspect of the invention, the method may include the step of forming a protective cap over the micromechanical device. The protective cap permits removal of the sacrificial material from the embedded micromechanical device. In one embodiment, the protective cap comprises polysilicon having openings therethrough.

The present invention achieves planarization of micromechanical devices and semiconductor circuits monolithically formed on a single substrate. As an optional feature of the invention, the micromechanical device may be encapsulated to protect it against particulate contamination. When the encapsulation is electrically conductive, it can function as a shield against electrical interference.

BRIEF DESCRIPTION OF THE DRAWINGS

For a better understanding of the present invention, reference is made to accompanying drawings, which are incorporated herein by reference and in which.

DETAILED DESCRIPTION

The process of the present invention is described in connection with fabrication of a monolithic accelerometer. The monolithic accelerometer includes a micromechanical acceleration sensor and a sensing circuit on a single substrate. The sensing circuit is connected to the acceleration sensor and provides an electrical signal representative of sensed acceleration. However, the process of the present invention is not limited to an accelerometer and may be applied to the fabrication of any micromechanical device and any semiconductor circuit on a single substrate. The micromechanical device may be a sensor or an actuator. The semiconductor circuit may utilize any suitable technology, including bipolar, MOS, CMOS, or a combination of these.

In general, the process of the invention involves forming a micromechanical device on a device area of a substrate, selectively depositing a planarization layer on the substrate in a circuit area thereof and forming a semiconductor circuit on the planarization layer in the circuit area of the substrate. The planarization layer is substantially coplanar with the upper surface of the micromechanical device and thereby achieves planarization and facilitates fabrication of the semiconductor circuit. The planarization layer is typically formed by selective deposition of an epitaxial silicon layer. Optionally, The micromechanical device may be encapsulated for protection against contamination.

Figure 1:
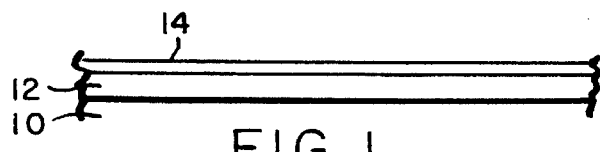
FIGS. 1–8 illustrate an example of a process for planarization in accordance with the invention, showing a substrate and overlying layers at selected stages during the process.

An example of the steps involved in fabrication of a micromechanical device is illustrated in FIGS. 1–7. The micromechanical device may be fabricated on a silicon substrate 10, typically 100 silicon. Fabrication of the micromechanical device is illustrated as fabrication of a sensor using a surface micromachined polysilicon process. It will be understood that the steps used to fabricate the micromechanical device can vary widely within the scope of the present invention. As shown in FIG. 1, a thick silicon oxide layer 12 is grown or deposited on the substrate 10, followed by formation of a thin silicon nitride layer 14. The nitride layer 14 is typically formed by low pressure chemical vapor deposition (LPCVD) or plasma enhanced chemical vapor deposition (PECVD).

Figure 2:
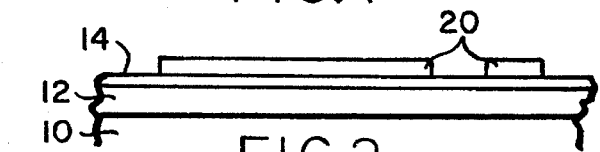
Figure 3:
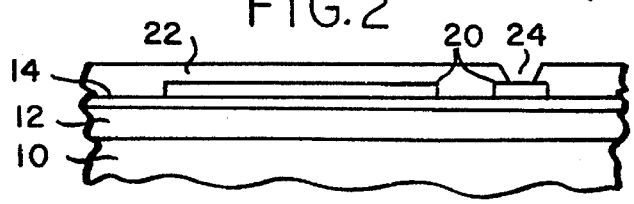

Referring now to FIG. 2, a first polysilicon layer 20 is deposited on nitride layer 14 by LPCVD and is patterned using conventional photolithography techniques. Next, a sacrificial dielectric layer 22 is formed on the device, as shown in FIG. 3. In general, the sacrificial layer 22 has a composition which permits it to be removed later in the process using a liquid or gas etchant, typically hydrofluoric acid (HF), for "release" of the micromechanical device. Usually, the sacrificial layer 22 is silicon oxide based and thus may be selected from a large number of compositions, including doped oxides such as phosphorous-doped glass (PSG), boron-phosphorus-doped glass (BPSG), tetraethyl orthosilicate glass (TEOS) and variations thereof. The sacrificial layer 22 typically has a thickness on the order of 1–2 micrometers, but its thickness can vary widely. One or more holes 24 are formed in the sacrificial layer 22, preferably by patterning and dry etching. Alternatively, wet etching techniques can be utilized to form holes 24. Holes 24 permit mechanical anchoring and electrical connection of the next polysilicon layer to first polysilicon layer 20.

Figure 4:
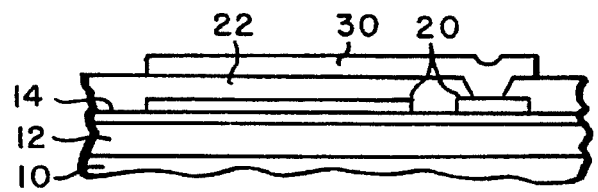

As shown in FIG. 4, a second polysilicon layer 30 is deposited on sacrificial layer 22 and is patterned and etched. The second polysilicon layer 30 may be the movable mass of the micromechanical device. The sacrificial layer 22 acts as a spacer between polysilicon layers 20 and 30 until the micromechanical device is later released by removal of the sacrificial layer. The polysilicon layer 30 may, for example, be 2 micrometers thick, but its thickness can vary widely. The polysilicon layer 30 is connected, both mechanically and electrically, through holes 24 to polysilicon layer 20.

Figure 5:
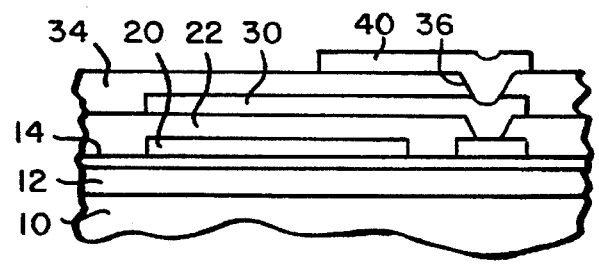

As shown in FIG. 5, a second sacrificial layer 34 is deposited on second polysilicon layer 30. The sacrificial layer 34 is typically a silicon oxide composition as described above in connection with sacrificial layer 22. The sacrificial layers 22 and 34 function as temporary spacers between elements of the micromechanical device and achieve planarization, at least in the region of the micromechanical device. Next, one or more holes 36 are etched in sacrificial layer 34 to permit mechanical anchoring and electrical connection of the next polysilicon layer to polysilicon layer 30. A third polysilicon layer 40 is deposited on the device and is patterned and etched. The patterned polysilicon layer 40 is another mechanical component of the micromechanical device.

Figure 6:
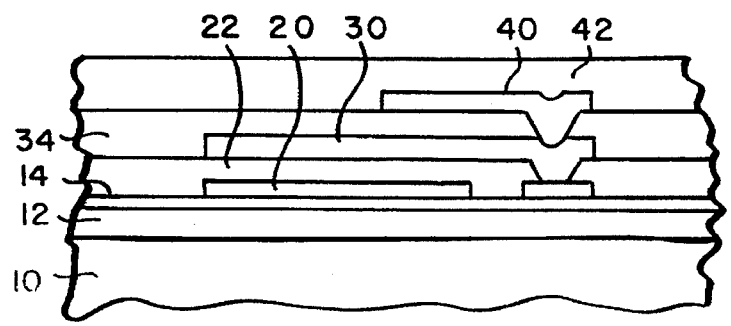

As shown in FIG. 6, a final sacrificial layer 42 for passivation and planarization is deposited on the device. Sacrificial layer 42 is typically a silicon oxide composition as described above in connection with sacrificial layer 22 and may be planarized using a variety of techniques, such as etchback or chemical mechanical polishing, so that the top surface of sacrificial layer 42 is flat.

Figure 7:
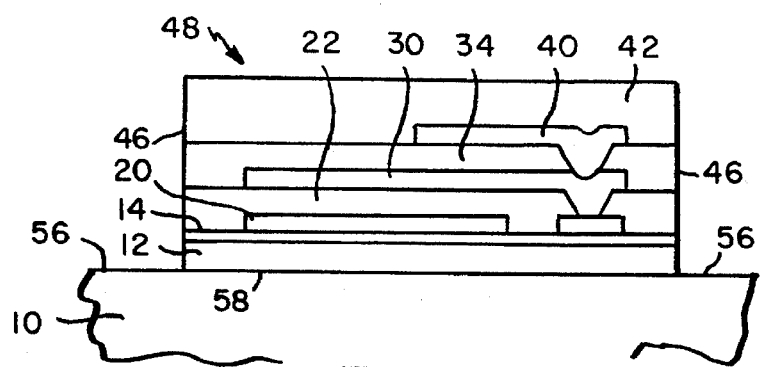

Next, all dielectric layers outside the micromechanical device area are removed down to the substrate 10, as shown in FIG. 7. Sacrificial layers 22, 34 and 42, oxide layer 12 and nitride layer 14 are removed using a technique that produces a substantially vertical sidewall 46 on the micromechanical device. The layers 22, 34, 42 and 14 are removed in a circuit area 56 of the substrate 10, but are not removed in a device area 58. Preferably, the layers 22, 34, 42 and 14 are removed using a vertical etch. The vertical etch is a dry etch which is anisotropic, i.e. the vertical etch rate is much higher than the lateral etch rate, thus forming a vertical sidewall. Examples of suitable vertical etches include fluorocarbon plasmas, $CF_4$, mixtures of $CF_4$ and $O_2$, $H_2$, and the like.

A micromechanical device 48 shown in FIG. 7 is substantially completed, except for removal of the sacrificial layers 22, 34 and 42. The device 48 of FIG. 7 is referred to as an embedded micromechanical device, because the device is embedded in the sacrificial layers. The dielectric layers are removed later in the process, as described below.

The micromechanical device 48 is illustrated in FIG. 7 as having two suspended polysilicon layers 30 and 40. Other configurations of the micromechanical device may have only a single suspended polysilicon layer 30. It will be understood that these and other configurations of the micromechanical device are included within the scope of the present invention. In addition, it will be understood that FIGS. 1–7 are schematic representations of the process of the invention and do not illustrate an actual micromechanical device. Examples of a suspended polysilicon microstructure and a method for fabricating the microstructure are disclosed in U.S. Pat. No. 5,326,726, issued Jul. 5, 1994 to Tsang et al.

Figure 8:
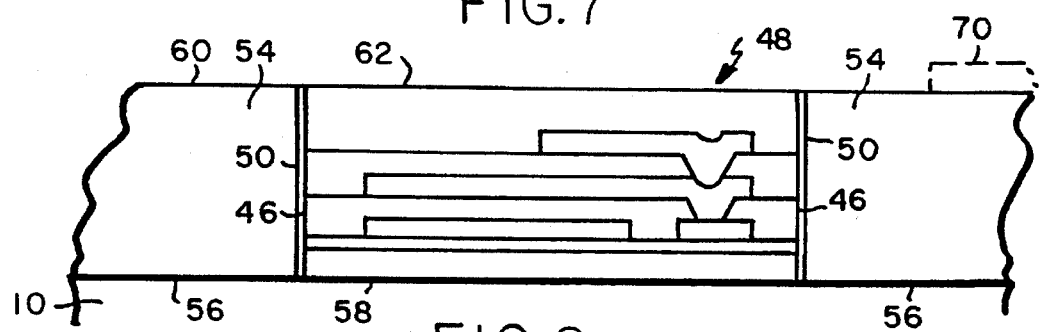

Following etching of the sacrificial layers 22, 34 and 42 in the circuit area 56, a thin polysilicon buffer layer may be deposited on the device and etched, typically using a combination of chlorine and fluorine plasma or a bromine-based plasma, so that a polysilicon spacer 50 remains only on the sidewall 46, as shown in FIG. 8. The polysilicon spacer 50, preferably having a thickness of about 1000 angstroms, functions as a transition layer between the oxide sacrificial layers of the micromechanical device and the epitaxial layer described below. The polysilicon spacer 50, which is optional, can be connected to a reference potential, such as ground, for electrical shielding of the micromechanical device. As described above, an optional silicon nitride layer can also be formed on sidewall 46 to protect any adjacent oxide in the circuit area 56.

Next, the surface of silicon substrate 10 is cleaned using a wet pre-epitaxial clean process followed by an in-situ anhydrous HCl etch or an $SF_6$ etch at lower temperatures. Better cleaning techniques and cleaner labs have made it possible to create device-quality epitaxial layers using only a low temperature wet clean process. Then, an epitaxial layer 54 is selectively deposited in areas not occupied by the micromechanical device 48. In particular, the epitaxial layer 54 is deposited in circuit area 56, where silicon substrate 10 is exposed, but is not deposited in device area 58, where the micromechanical device 48 is located. The epitaxial layer 54 functions as a planarization layer, the top surface of which is substantially coplanar with the top surface of micromechanical device 48.

Selective deposition of epitaxial silicon is described, for example, by S. Wolf et al in *Silicon Processing For The VLSI Era, Vol. 1, Process Technology*, pp. 155–156. The process of the present invention preferably employs Type 1 selective epitaxial deposition, wherein deposition occurs only on the exposed substrate. Alternatively, Type 2 deposition of epitaxial silicon can be utilized. In Type 2 epitaxial deposition, a layer of polysilicon is formed over the micromechanical device 48. The polysilicon deposited over the micromechanical device can be stripped off and does not present a serious limitation. In prior art VLSI processes, epitaxial deposition is typically used to fill tiny holes in silicon dioxide to form small pockets or islands of epitaxial silicon. The prior art process is relatively difficult. In the present invention, epitaxial silicon is grown around a relatively large oxide island, and this is much easier to accomplish.

The epitaxial layer 54 may be deposited such that its upper surface is substantially coplanar with or slightly above the upper surface of micromechanical device 48. Typically, the required thickness of epitaxial layer 54 is on the order of a few micrometers. In one approach, the epitaxial layer 54 is deposited such that its upper surface is substantially coplanar with the upper surface of the micromechanical device 48. In another approach, the epitaxial layer 54 is deposited such that its upper surface is at least slightly above the upper surface of the micromechanical device, and then the surface of the epitaxial layer 54 is subjected to a grinding process to make it coplanar with an upper surface 62 of micromechanical device 48. The goal of either approach is to produce an epitaxial layer 54 having upper surface 60 which is substantially coplanar with the upper surface 62 of micromechanical device 48, thereby achieving planarization.

In many circuit fabrication processes, the thickness of the epitaxial layer must be carefully controlled. In general, the thickness of the epitaxial layer required by the circuit process may be different from the thickness required for planarization with the micromechanical device 48. The above discussion assumes that the thickness of the epitaxial layer required for the circuit process is the same as the thickness required for planarization. Two other cases must be considered.

Figure 12:
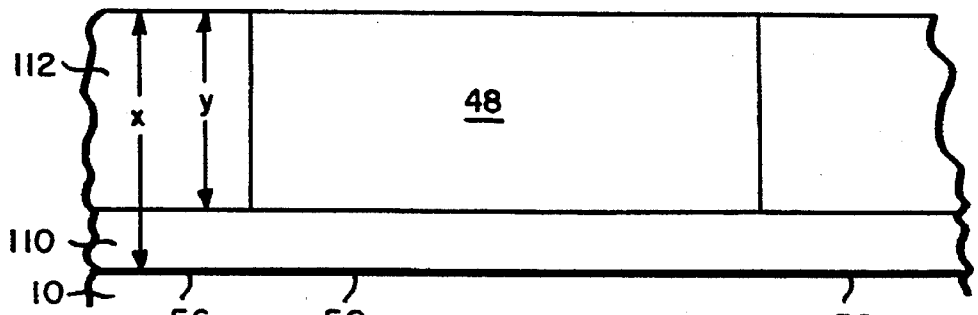
FIG. 12 schematically illustrates an example of a device wherein the circuit process requires an epitaxial layer having a thickness that is greater than that required for planarization of the micromechanical device.

In a first case, illustrated in FIG. 12, the circuit process requires an epitaxial layer of thickness X, and the micromechanical device 48 requires a thickness Y for planarization, where X is greater than Y. An epitaxial layer 110 of thickness X-Y is deposited on the substrate 10 before the micromechanical device 48 is fabricated. Next, the micromechanical device 48 is fabricated on layer 110, and the oxide layers associated therewith are removed in the circuit area 56 using a vertical etch (see FIG. 7). Then an epitaxial layer 112 of thickness Y is deposited on layer 110 in the circuit area 56 to produce a structure in which the top surface of the epitaxial layer 112 is coplanar with the top surface of the micromechanical device, and the epitaxial layers 110 and 112 have a total thickness of X micrometers in the circuit area 56.

Figure 13:
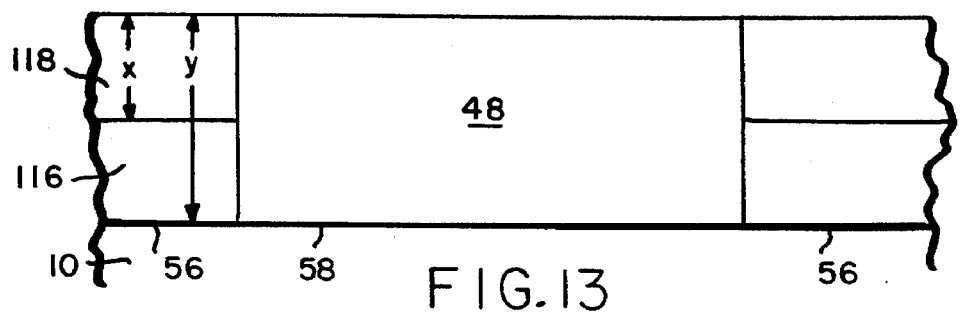
FIG. 13 schematically illustrates an example of a device wherein the circuit process requires an epitaxial layer having a thickness that is less than that required for planarization of the micromechanical device.

In a second case, illustrated in FIG. 13, the circuit process requires an epitaxial layer of thickness X micrometers that is less than the thickness Y required to planarize the circuit area 56 with the micromechanical device 48. In this case, the oxide layers of the micromechanical device are etched using a vertical etch as shown in FIG. 7. Then, two epitaxial layers are successively deposited in the circuit area 56. A first epitaxial layer 116 is a substrate epitaxial layer, usually heavily doped, having a thickness of Y-X. Then, a circuit epitaxial layer 118 of thickness X is deposited to provide planarization between the micromechanical device 48 and the circuit area 56.

The micromechanical device 48 is encapsulated on all sides by the epitaxial layer 54. A semiconductor circuit 70, shown in phantom in FIG. 8, will be fabricated on the upper surface 60 of epitaxial layer 54. The semiconductor device 70 is shown in phantom, because it is preferably fabricated following the interconnection and encapsulation steps described below. Since most semiconductor circuits are fabricated on epitaxial wafers, the epitaxial layer 54 is very suitable for fabrication of semiconductor circuit 70. The semiconductor circuit 70 is fabricated at the level of the upper surface 62 of micromechanical device 48. Interconnection between the micromechanical device 48 and the semiconductor circuit 70 is easily achieved, as described below. Thus, the epitaxial layer 54 achieves global planarization in a monolithic device which incorporates a micromechanical device and a semiconductor circuit.

Figure 9:
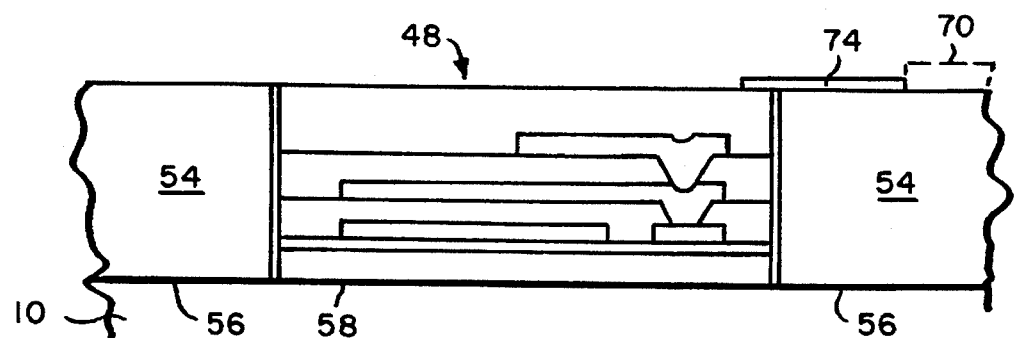
FIGS. 9 and 10 illustrate an example of a process for interconnecting the micromechanical device and the semiconductor circuit in FIG. 8.
Figure 10:
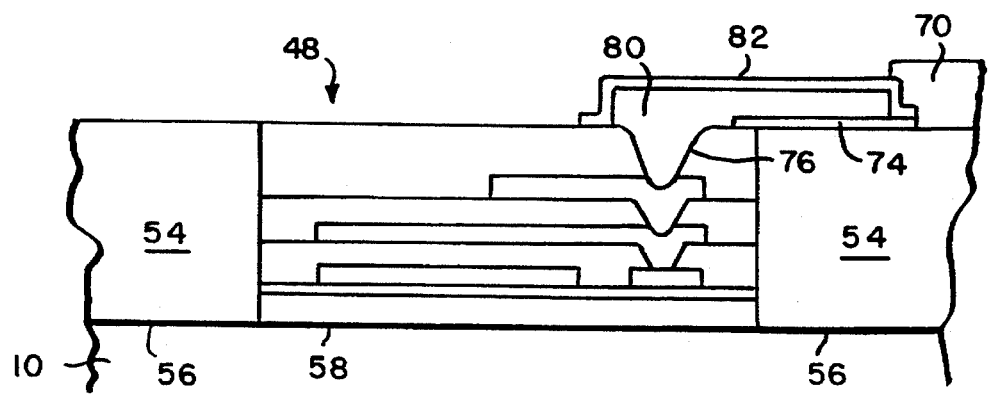

A process for interconnecting the micromechanical device 48 to semiconductor circuit 70 is described with reference to FIGS. 9 and 10. A dielectric layer 74 is deposited on the surface of the device and is patterned to cover the transition region between micromechanical device 48 and epitaxial layer 54. The dielectric layer 74 can, for example, be silicon nitride having a thickness of 1000–1500 angstroms. In general, the dielectric layer 74 must be able to withstand the etchant (usually HF-based) used for release of the micromechanical device and must be electrically insulating. Another suitable choice is silicon-rich nitride. Next, a hole 76 is etched through sacrificial layer 42 to polysilicon layer 40. Then, a polysilicon interconnect layer 80 is deposited and patterned. The interconnect layer 80 fills hole 76, thereby electrically contacting polysilicon layer 40, and covers dielectric layer 74. Then, the interconnect layer 80 is passivated by forming a protective layer 82, which may be silicon nitride or silicon oxide. In general, the layer 82 is selected to protect interconnect layer 80 during the circuit fabrication process. The interconnect layer 80 is connected to the semiconductor circuit during the fabrication of the semiconductor circuit.

The process steps for fabrication of semiconductor circuit 70 are then performed. The interconnect between the semiconductor circuit 70 and the micromechanical device 48 is through the interconnect layer 80, which was passivated with layer 82 to protect it during the initial high temperature circuit processing steps. It will be understood that the interconnect layer 80 can form more than one electrical connection between the micromechanical device 48 and the semiconductor circuit 70. In a preferred embodiment, the semiconductor circuit is a CMOS circuit. However, other semiconductor circuit technologies are included within the scope of the present invention. Process steps for fabrication of semiconductor circuits are well-known to those skilled in the art and will not be described in detail.

After completion of semiconductor circuit processing, the circuit is protected, typically using one of a variety of photoresists and polymers. In general, the protective layer is required to withstand the release etch process, must not delaminate, must be patternable using photolithography techniques, and must be easily removable. Then, the sacrificial layers 22, 34 and 42 in the micromechanical device 48 are removed, preferably using an HF-based acid in a wet etching process. The etching process releases the micromechanical structure, thereby enabling movement of the elements of the micromechanical device. In the embodiment of FIG. 10, the micromechanical device 48 is not protected from the top, but is protected on all sides by epitaxial layer 54.

Figure 11:
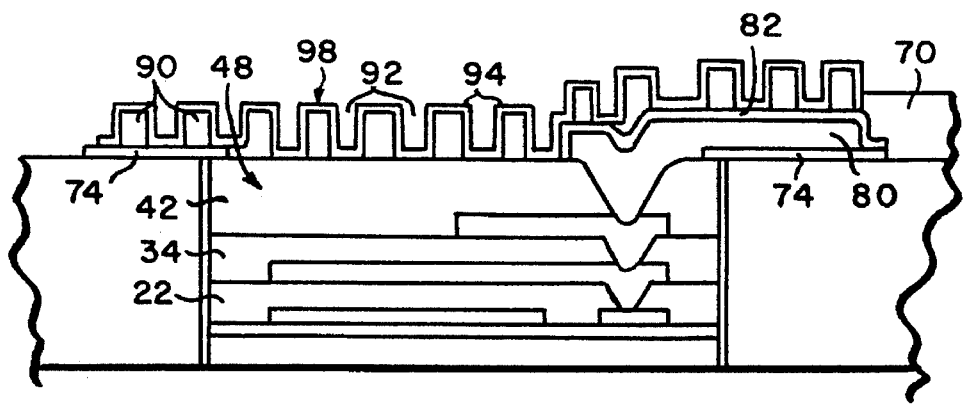
FIG. 11 illustrates an example of the formation of a protective cap over the micromechanical device.

According to another feature of the invention, the micromechanical device 48 may optionally be capped, or covered, so that it is completely encapsulated and is thereby protected against particulate contamination. Formation of a cap over the micromechanical device 48 is described with reference to FIG. 11. In this embodiment, the dielectric layer 74 surrounds the micromechanical device 48 in the transition region between the micromechanical device and the epitaxial layer 54. The dielectric layer 74 functions as an anchor for the cap, as well as a base for interconnect layer 80. A relatively thick polysilicon layer 90, typically having a thickness of 1–2 micrometers, is deposited on the device shown in FIG. 10 and is patterned. The polysilicon layer 90 is patterned, at least in the region covering micromechanical device 48, to form a grid-like pattern having openings 92 to the micromechanical device 48 below. Then, a relatively thin polysilicon layer 94 is deposited on patterned polysilicon layer 90. The polysilicon layer 94 typically has a thickness on the order of 1000 angstroms. The polysilicon layer 94 must be sufficiently thin to allow passage of an etching liquid into the micromechanical device 48 during the release process. The polysilicon layers 90 and 92 form a protective cap 98 that is analogous to a sieve or screen. The cap 98 prevents particulate contamination of the micromechanical device but allows the etching liquid to pass into the micromechanical device during the release process. The sacrificial layers 22, 34 and 42 are removed by wet etching through the cap 98 formed by polysilicon layers 90 and 94. The polysilicon interconnect layer 80 to semiconductor circuit 70 is formed in the manner described above in connection with FIG. 10.

In the resulting device, the micromechanical device 48 is fully encapsulated and has insulated interconnects to semiconductor circuit 70. The cap 98 defined by polysilicon layers 90 and 94 is anchored to the dielectric layer 74. The cap 98 can be connected to a reference potential, such as ground, for electrical shielding of the micromechanical device. It will be understood that the cap can have any desired pattern of openings that will permit the etching liquid to enter the micromechanical device 48 during the release process.

In some cases, it may be important to reduce the parasitic capacitance between the interconnects and the substrate. As shown in FIG. 10, the polysilicon interconnect layer 80 is separated from the epitaxial layer 54 only by the dielectric layer 74, which is typically silicon nitride having a high dielectric constant. This configuration may be acceptable in many applications, but not in certain critical applications which require low parasitic capacitance.

Figure 14:
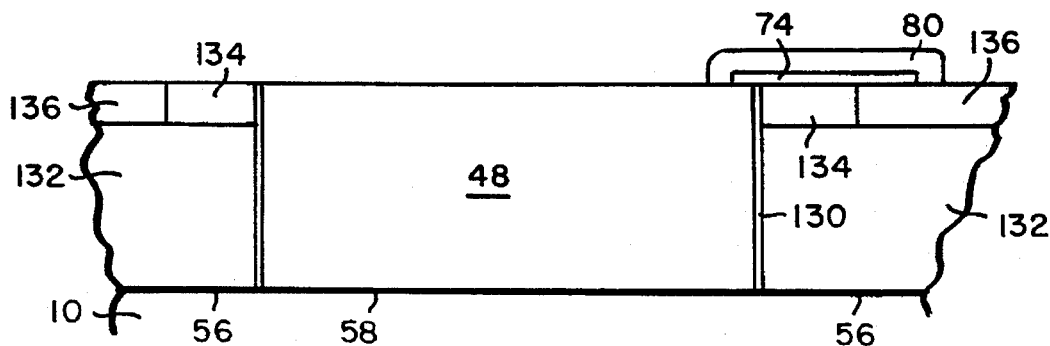
FIG. 14 illustrates an example of a device having an oxide layer for reduced parasitic capacitance between the interconnect layer and the epitaxial layer.

One method of reducing the parasitic capacitance is to place an oxide layer under the nitride layer to minimize parasitic capacitance. As shown in FIG. 14, the micromechanical device 48 is formed on substrate 10 and the oxide layers are removed from the circuit area 56 by vertical etching. The next step is to deposit a spacer 130 on the sidewall of the micromechanical device 48. The spacer 130 may include a polysilicon layer having a thickness of about 1000 angstroms and a silicon nitride layer having a thickness of about 1000 angstroms. The spacer 130 may be formed in a manner similar to the spacer 50 described above. Since silicon nitride and polysilicon etch in the same gases, the spacer 130 involves one additional deposition. Next, an epitaxial layer 132 is selectively deposited to a thickness less than the vertical thickness of micromechanical device 48. Then, a thermal oxide is grown, which oxidizes the epitaxial layer 132, leaving an oxide surface that is coplanar with the upper surface of micromechanical device Alternatively, the thermal oxide can be deposited, and etchback techniques can be used to make the oxide planar with micromechanical device 48. The key feature is that after oxide formation, the top of the oxide is substantially coplanar with the upper surface of micromechanical device 48. The oxide is patterned, leaving an oxide layer 134, either in a ring around the micromechanical device or only underneath the interconnect layers to be formed later in the process. The general requirement of the oxide layer 134 is that it have a relatively low dielectric constant so as to reduce parasitic capacitance. Then, an additional epitaxial layer 136 is selectively deposited on epitaxial layer 132 to match the height of the oxide layer 134, so that the upper surface of the device is planar. The semiconductor circuit 70 and the interconnect layer 80 can then be formed in the manner described above. The oxide layer 134 is positioned beneath the interconnect layer 80 and reduces the parasitic capacitance between the interconnect layer 80 and the epitaxial layer 132. The addition of the nitride layer to the spacer 130 protects the oxide layer 134 during the release etch process.

In the examples described above, planarization between a micromechanical device and a semiconductor circuit is achieved by selective epitaxial deposition of silicon. More generally, the planarization technique utilizes selective deposition of a planarization layer in the circuit area of the substrate to align the circuit level with the upper surface of the micromechanical device. While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for fabricating a micromechanical device in a device area of a substrate and a semiconductor circuit in a circuit area of the substrate, comprising the steps of:

forming a micromechanical device on the device area of said substrate, said micromechanical device being embedded in a sacrificial material and having an upper surface;

forming a planarization layer on said substrate in said circuit area, said planarization layer being formed with an upper surface that is substantially coplanar with the upper surface of said micromechanical device;

forming a semiconductor circuit comprising at least one semiconductor device on said planarization layer in said circuit area; and removing the sacrificial material from said embedded micromechanical device.

2. A method as defined in claim 1 wherein the step of forming said planarization layer includes selectively depositing said planarization layer such that the upper surface thereof is substantially coplanar with the upper surface of said embedded micromechanical device.

3. A method as defined in claim 1 wherein the step of forming said planarization layer includes selectively depositing said planarization layer at least slightly above the upper surface of said embedded micromechanical device and grinding said planarization layer until an upper surface of said planarization layer is substantially coplanar with the upper surface of said embedded micromechanical device.

4. A method as defined in claim 1 wherein the step of forming a planarization layer includes conditioning the surface of said substrate in said circuit area.

5. A method as defined in claim 1 wherein said micromechanical device comprises an acceleration sensor and said semiconductor circuit comprises a sensing circuit connected to said acceleration sensor.

6. A method as defined in claim 1 wherein the step of forming said planarization layer includes selectively depositing an epitaxial layer such that epitaxial deposition does not occur on the upper surface of said embedded micromechanical device.

7. A method as defined in claim 1 wherein the step of forming said planarization layer includes selectively depositing an epitaxial layer such that a polysilicon layer is formed on the upper surface of said embedded micromechanical device.

8. A method as defined in claim 4 further including the steps of forming a buffer layer on said substrate prior to the step of forming said planarization layer, and etching said buffer layer to leave a sidewall spacer on said micromechanical device.

9. A method as defined in claim 8 wherein said sidewall spacer comprises conductive polysilicon and further including the step of forming an electrical connection to said sidewall spacer for interconnecting said sidewall spacer to a reference potential.

10. A method as defined in claim 8 wherein said sidewall spacer comprises a polysilicon layer and a silicon nitride layer.

11. A method as defined in claim 1 further including the step of forming at least one electrical connection between said micromechanical device and said semiconductor circuit.

12. A method as defined in claim 1 wherein the step of removing the sacrificial material from said embedded micromechanical device includes a wet etch process.

13. A method as defined in claim 1 further including the step of forming a protective cap over said micromechanical device, said protective cap permitting removal of the sacrificial material from said embedded micromechanical device.

14. A method as defined in claim 13 wherein said protective cap comprises a polysilicon cap having openings therethrough.

15. A method for fabricating a micromechanical device on a substrate, comprising the steps of:

forming a micromechanical device on a device area of said substrate, said micromechanical device being embedded in sacrificial material and having an upper surface;

exposing a circuit area of said substrate;

selectively depositing an epitaxial layer on said substrate in said circuit area, said epitaxial layer being formed with an upper surface that is substantially coplanar with the upper surface of said embedded micromechanical device;

forming a semiconductor circuit comprising at least one semiconductor device on the upper surface of said epitaxial layer in said circuit area; and removing the sacrificial material from said embedded micromechanical device.

16. A method as defined in claim 15 wherein the step of exposing the circuit area of said substrate includes removing the sacrificial material deposited in the circuit area of said substrate during the step of forming said micromechanical device.

17. A method as defining claim 15 wherein the step of forming said micromechanical device includes forming an acceleration sensor and the step of forming said semiconductor circuit includes forming a sensor circuit connected to said acceleration sensor.

18. A method as defined in claim 15 further including the steps of forming a buffer layer on said substrate prior to the step of selectively depositing an epitaxial layer on said substrate, and etching said buffer layer to leave a sidewall spacer on said micromechanical device.

19. A method as defined in claim 18 wherein said sidewall spacer comprises conductive polysilicon and further including the step of forming an electrical connection to said sidewall spacer for interconnecting said sidewall spacer to a reference potential.

20. A method as defined in claim 15 further including the step of forming a protective cap over said micromechanical device, said protective cap permitting removal of said sacrificial material from said embedded micromechanical device.

21. A method as defined in claim 15 further including the step of forming at least one electrical interconnection between said micromechanical device and said semiconductor circuit.

22. A method as defined in claim 15 wherein the step of depositing said epitaxial layer includes forming said epitaxial layer with a thickness that is approximately equal to the total thickness of said embedded micromechanical device above said substrate.

23. A method as defined in claim 15 further including the steps of forming at least one electrical interconnect between said micromechanical device and said semiconductor circuit and forming a layer having a low dielectric constant between said electrical interconnect and said epitaxial layer.

24. A method as defined in claim 23 wherein said layer having a low dielectric constant comprises silicon oxide.

25. A method as defined in claim 24 further including the step of forming a sidewall spacer on a sidewall of said micromechanical device, said sidewall spacer comprising a polysilicon layer and a silicon nitride layer.

26. A method as defined in claim 15 wherein the step of selectively depositing an epitaxial layer on said substrate in said circuit area includes selectively depositing a first layer having a first doping characteristic on said substrate and selectively depositing a second layer having a second doping characteristic on said first layer.

27. A method for fabricating a micromechanical device on a substrate, comprising the steps:

forming a first epitaxial layer on said substrate;

forming a micromechanical device on a device area of said first epitaxial layer, said micromechanical device being embedded in sacrificial material and having an upper surface;

exposing a circuit area of said first epitaxial layer;

forming a second epitaxial layer on said first epitaxial layer in said circuit area, said second epitaxial layer being formed with an upper surface that is substantially coplanar with the upper surface of said embedded micromechanical device;

forming a semiconductor circuit comprising at least one semiconductor device on the upper surface of said second epitaxial layer in said circuit area; and removing the sacrificial material from said embedded micromechanical device.

* * * * *